United States Patent [19]
Taura et al.

[11] Patent Number: 5,909,406
[45] Date of Patent: Jun. 1, 1999

[54] SEMICONDUCTOR MEMORY DEVICE

[75] Inventors: Tadayuki Taura, Zushi; Shigeru Atsumi; Akira Umezawa, both of Yokohama, all of Japan

[73] Assignee: Kabushiki Kaisha Toshiba, Tokyo, Japan

[21] Appl. No.: 09/030,671

[22] Filed: Feb. 25, 1998

[30] Foreign Application Priority Data

Feb. 26, 1997 [JP] Japan ................................ 9-042236

[51] Int. Cl.$^6$ ................................. G11C 8/00; G11C 7/00

[52] U.S. Cl. ................................. 365/230.03; 365/226

[58] Field of Search ................. 365/230.03, 230.06, 365/189.09, 226

[56] References Cited

U.S. PATENT DOCUMENTS

| | | | |
|---|---|---|---|
| 5,136,546 | 8/1992 | Fukuda et al. | 365/230.03 |
| 5,553,026 | 9/1996 | Nakai et al. | 365/230.03 |
| 5,579,260 | 11/1996 | Iwahashi | 365/189.05 |

*Primary Examiner*—Trong Phan
*Attorney, Agent, or Firm*—Loeb & Loeb LLP

[57] ABSTRACT

Memory cell arrays, in which memory cells are arranged in a matrix, are divided into a plurality of blocks. In a semiconductor memory device having the memory cell arrays, load circuits are connected to bus lines and the memory cell arrays. The number of load circuits is the same as that of the memory cell arrays. Thus, the load circuits function to supply the same amount of current to the bus lines, whatever block is activated in a writing operation. Therefore, writing characteristics of all the memory cell array blocks are the same.

16 Claims, 3 Drawing Sheets

5,909,406

SEMICONDUCTOR MEMORY DEVICE

BACKGROUND OF THE INVENTION

The present invention relates to a data-readable/writable semiconductor memory device using a MOS transistor as a memory element.

As shown in FIG. 1, a nonvolatile transistor used as a memory cell of an EEPROM for electrically erasing data is formed of two polycrystalline silicon layers insulated from each other by an insulating film.

A first polycrystalline silicon layer forms a floating gate 701 and a second polycrystalline silicon layer forms a control gate 702. A reference numeral 703 denotes a source, 704 a drain, 705 a silicon substrate, 706 a contact hole and 707 a data line formed of Al (aluminum). The data line 707 is connected to the drain 704 through a contact hole 706.

Operations of writing, reading and erasing data in the memory cell having the aforementioned structure will be described below.

A writing operation is performed by setting a drain potential $V_D$ to 5.5V, a control gate potential $V_{CG}$ to 10V and a source potential $V_S$ to 0V, and injecting hot electrons into the floating gate.

An erasing operation is performed by setting a control gate potential $V_{CG}$ to −7V and setting a drain potential $V_D$ in a floating state, and applying a voltage of, for example, 6.5V to the source. At this time, electrons are extracted from the floating gate to the source by tunnel effect.

A reading operation is performed by setting a control gate potential $V_{CG}$ to −7V, a drain potential $V_D$ to 0.8V, and a source potential $V_S$ to 0V. At this time, if the memory data in the memory cell is "0" (write state), substantially no current flows between the source and the drain. If the memory data is "1" (erase state), a cell current of about 60 $\mu$A flows between the source and the drain.

Memory cell arrays including memory cells as described above are arranged as shown in FIG. 2, divided into blocks $B_0$ to $B_j$, each including memory cell arrays $IO_0$ to $IO_i$, so that data can be partially written and erased. The term "block" means a unit for performing writing/erasing operations.

In FIG. 2, the memory cell arrays $IO_0$ to $IO_i$, divided into blocks, are respectively connected to data bus lines $DL_0$ to $DL_i$ through column gates 11. The data bus lines $DL_0$ to $DL_i$ are respectively connected to buffer circuits $13_0$ to $13_i$ through, for example, sense amplifiers $12_0$ to $12_i$.

The data bus lines $DL_0$ to $DL_i$ are respectively connected to load circuits $14_0$ to $14_i$, each having a comparatively large-size transistor. The load circuits are collected in a group away from the memory cell arrays. Therefore, due to parasitic resistance of the data bus lines $DL_0$ to $DL_i$, a difference in potential drop is made between the block $B_0$ near the group of load circuits and a block $B_j$ far from them. Accordingly, the writing characteristic in the former block is different from that of the latter.

FIG. 3 is a circuit diagram showing a structure of a load circuit $14_i$ of the load circuits $14_0$ to $14_i$.

The load circuit comprises a load transistor circuit, in which an N-channel MOS transistor Tr is connected between a power source VPOWER and a data line $DL_i$.

A gate input $PRGH_i$ input to the transistor Tr is high in potential, when write data to be supplied to a memory cell is "0". At this time, the drain potential is transmitted to the memory cell. On the other hand, when write data is "1", the gate input $PRGH_i$ is equal to a ground potential. At this time, the drain of the memory cell is in a floating state, and therefore no writing operation is performed.

As described above, the prior art has the following drawbacks.

In the conventional semiconductor memory device, since the load circuits (comparatively great load circuits), functioning in a writing operation, are collected in a group away from the memory cell arrays and connected to the corresponding blocks of the memory cell arrays only by the data bus lines, a difference in writing characteristic is made between a block near the group of load circuits and a block far from them, due to parasitic resistance of the data bus lines.

BRIEF SUMMARY OF THE INVENTION

Accordingly, it is an object of the present invention to provide a semiconductor device having an improved structure, in which the distances between the load circuits and the memory cells are substantially equal, so that writing characteristics of all the memory cell array blocks are the same.

According to an aspect of the present invention, there is provided a semiconductor memory device comprising: a plurality of memory cell arrays, in which memory cells are arranged in a matrix, the plurality of memory cell arrays being divided into a plurality of blocks; a plurality of selector circuits, respectively provided for the plurality of memory cell arrays, for selecting one of the plurality of memory cell arrays; a plurality of bus lines connected to memory cell arrays in each block, a number of the plurality of bus lines being same as that of the memory cell arrays in each block; and a plurality of load circuits for transferring data, respectively connected to the plurality of selector circuits, a number of the plurality of load circuits being the same as that of the plurality of memory cell arrays.

According to another aspect of the present invention, there is provided a semiconductor memory device comprising: a plurality of memory cell arrays, in which memory cells are arranged in a matrix, the plurality of memory cell arrays being divided into a plurality of blocks; a plurality of selector circuits, respectively provided for the plurality of memory cell arrays, for selecting one of the plurality of memory cell arrays; a plurality of bus lines connected to memory cell arrays in each block, a number of the plurality of bus lines being same as that of the memory cell arrays in each block; and a plurality of load circuits for transferring data, respectively connected to the plurality of selector circuits, a number of the plurality of load circuits being the same as that of the plurality of memory cell arrays, and the plurality of load circuits functioning to supply the same amount of current to the plurality of bus lines, whatever block is activated in a writing operation.

In the semiconductor memory devices according to the first and second aspects, the memory cell arrays in each block may be accessed in parallel through the bus lines.

Distances between the plurality of memory cell arrays and the plurality of load circuits may be substantially equal.

Each of the plurality of load circuits may comprise a load transistor circuit having a control terminal to which a signal varying in accordance with write data is supplied.

The load transistor circuit may comprise a first transistor a gate of which is connected to a writing voltage control power source and a second transistor a gate of which is applied with a signal varying in accordance with write data, the first and second transistors being connected in series between a first power source and a corresponding bus line.

The first power source may generate power having a potential boosted in the semiconductor memory device.

The writing voltage control power source may generate power higher by at least a threshold voltage of the first transistor than a drain voltage for writing data into a memory cell.

The threshold voltage of the first transistor may be controlled by adjusting a concentration of a well layer in the transistor.

A high level of the signal varying in accordance with write data may be higher than a level of a source signal of the writing voltage control power source.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

Prior to describing an embodiment of the present invention, the basic concept of the present invention will be described briefly, so that the present invention can be understood easily.

Memory cell arrays including memory cells arranged in a matrix are divided into a plurality of memory cell array blocks (units for performing writing/erasing operations). In the semiconductor memory device of this structure, according to the present invention, load circuits of the same number as that of column gates (selector circuits) are connected to bus lines and the column gates, such that the distances between the blocks and the corresponding load circuits are the same. With this structure, whatever block is activated in a writing operation, the load circuit connected to the bus line functions so as to supply the same suitable current to the bus line.

Hence, there is no difference in writing characteristic between memory cell array blocks.

An embodiment of the present invention will be described in detail with reference to the accompanying drawings.

Figure 4:
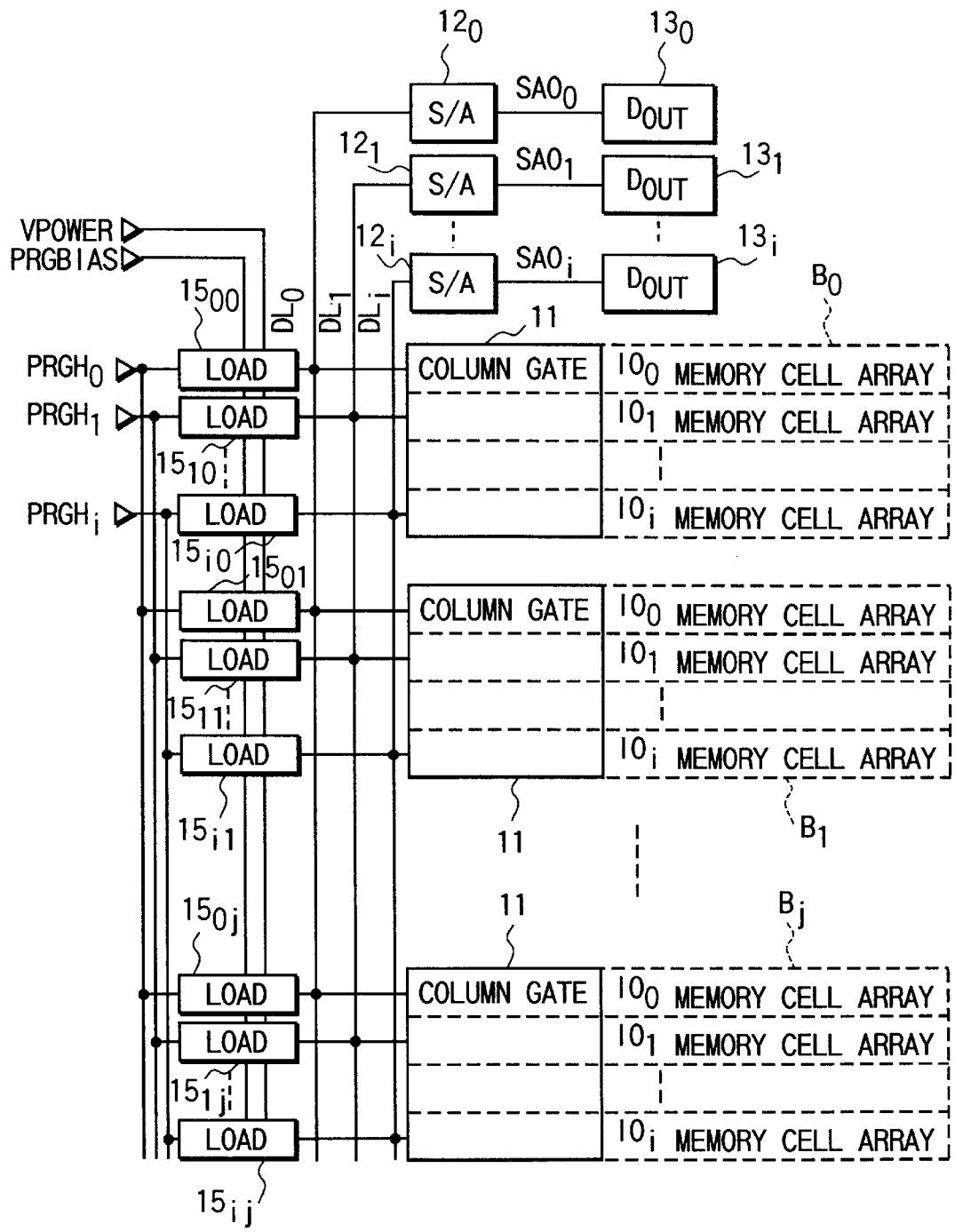
FIG. 4 is a circuit diagram showing main part of a semiconductor memory device according to the present invention.

FIG. 4 is a circuit diagram showing main part of a semiconductor memory device according to the present invention.

Memory cell arrays are divided into blocks $B_0$ to $B_j$ to allow partial writing and erasing operations. The term "block" means a unit for performing writing/erasing operations. More specifically, the memory cell arrays are divided into blocks used as data input/output (I/O) units. All the blocks include the same number of memory cell allays $IO_0$ to $IO_i$. The memory cells in the memory cell arrays $IO_0$ to $IO_i$ in each block can be normally accessed in parallel.

The memory cells in the memory cell arrays $IO_0$ to $IO_i$ in each block are respectively connected to data bus lines $DL_0$ to $DL_i$ through column gates 11 constituted by selection transistors for selecting a column corresponding to an address. The data bus lines $DL_0$ to $DL_i$ are respectively connected to buffer circuits $13_0$ to $13_i$ through, for example, sense amplifiers $12_0$ to $12_i$.

Load circuits $15_{00}$ to $15_{ij}$ are connected to the column gates 11 and the bus lines $DL_0$ to $DL_i$, contributing to data transfer in a process such as data writing.

In this embodiment, the (j+1) number of memory cell arrays $IO_0$ in each block are connected to the (j+1) number of load circuits $15_{00}, 15_{01}, \ldots, 15_{0j}$, not one load circuit as in the conventional art. Similarly, the (j+1) number of memory cell arrays $IO_1$ in each block are connected to the (j+1) number of load circuits $15_{10}, 15_{11}, \ldots, 15_{1j}$, and the (j+1) number of memory cell arrays $Io_i$ in each block are connected to the (j+1) number of load circuits $15_{i0}, 15_{i1}, \ldots, 15_{ij}$.

Figure 2:
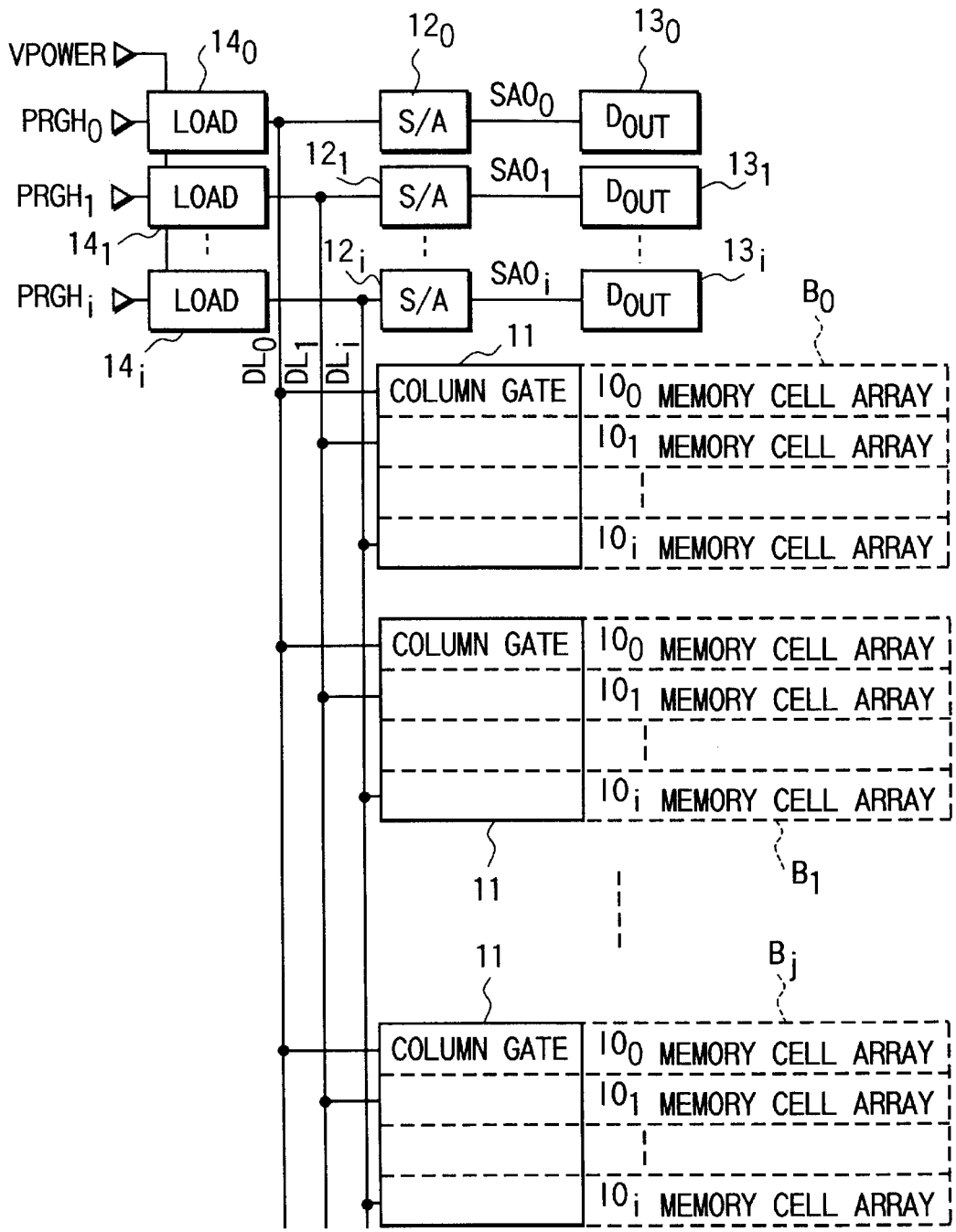
FIG. 2 is a circuit diagram showing main part of a conventional semiconductor memory device including load circuits functioning in a writing operation.

Thus, it is considered that the load circuit $14_0$ of the prior art (FIG. 2) corresponds to the group of load circuits $15_{00}, 15_{01}, \ldots, 15_{0j}$, the load circuit $14_1$ of the prior art corresponds to the group of load circuits $15_{10}, 15_{11}, \ldots, 15_{1j}$, and the load circuit $14_i$ of the prior art corresponds to the group of load circuits $15_{i0}, 15_{i1}, \ldots, 15_{ij}$.

One end of each of the load circuits $15_{00}$ to $15_{ij}$ is connected to the corresponding bus line, and the other end thereof is connected to a high potential power source. The high potential power is generated in this memory device by boosting power.

With the above structure, since the load circuits $15_{00}$ to $15_{ij}$ connected to the bus lines $DL_1$ to $DL_i$ are separately arranged for the corresponding memory cell arrays, the distances between the load circuits and the memory cell arrays are equalized.

Thus, since the distances between the memory cell arrays $IO_0$ to $IO_i$ in each block and the corresponding load circuits $15_{00}$ to $15_{ij}$ are equalized, the writing characteristics of the memory cells in each block are substantially the same.

Since the load of the (j+1) number of load circuits $15_{00}$ to $15_{ij}$ of this embodiment corresponds to that of one load circuit $14_i$ of the conventional art, the size of one load circuit $15_{ij}$ is 1/(the number of the blocks) the size of the conventional load circuit $14_i$. Therefore, the load circuits of this embodiment do not hinder the layout or the integration of the memory device.

Further, with the above structure, whatever block is activated, a current necessary for writing is supplied to the bus line by the function of the load circuit connected to bus line.

Figure 1:
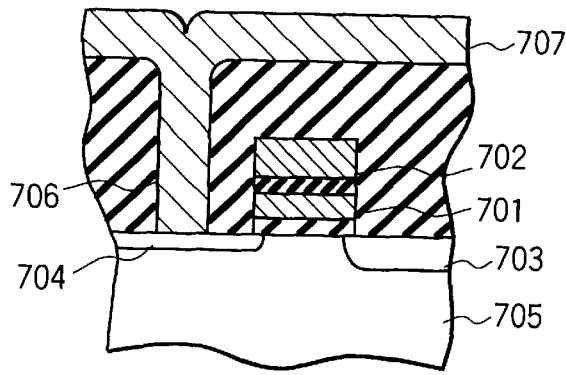
FIG. 1 is a cross-sectional view of a conventional non-volatile transistor used as a memory cell of an EEPROM.
Figure 3:
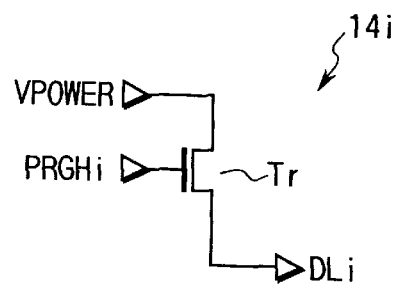
FIG. 3 is a circuit diagram showing a structure of one of the load circuits shown in FIG. 1.
Figure 5:
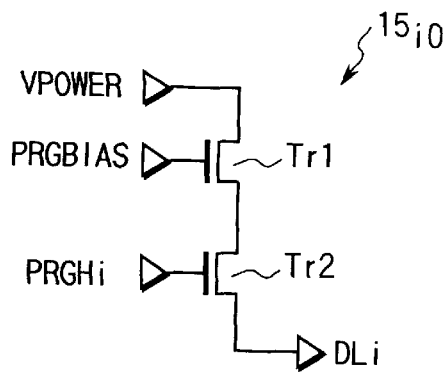
FIG. 5 is a circuit diagram showing a structure of one of the load circuits shown in FIG. 4.

FIG. 5 is a circuit diagram showing a structure of the load circuit $15_{i0}$ of the load circuits $15_{00}$ to $15_{ij}$ shown in FIG. 4.

The load circuit comprises a load transistor circuit. A signal varying in accordance with write data is supplied to a control terminal of the load transistor circuit. In the load circuit, N-channel MOS transistors Tr1 and Tr2 are connected in series between a power source VPOWER and a data bus line ($DL_i$). As described above, the power source VPOWER is a high-potential power source for supplying a comparatively great writing current, when data is written into a memory cell.

A writing voltage control signal PRGBIAS is applied to the gate of the transistor Tr1. The signal has a function of limiting a drain voltage in a writing operation. The writing voltage control signal is set to a voltage higher than the drain voltage by Vth (the threshold voltage) of the transistor Tr1. As will be described later, the threshold voltage Vth can be controlled by adjusting the concentration of a well layer in the transistor.

A gate input $PRGH_i$ of the transistor Tr2 varies in accordance with write data. More specifically, when write data "0", the input is high in potential and the drain voltage is transmitted to the memory cell. When write data is "1", the input has the ground potential, the drain of the memory cell is floating and no writing operation is executed. It is preferable that the high level of the signal varying in accordance with the written data be higher than the level of the aforementioned writing voltage control signal.

As regards the load transistor circuit described above, the transistors Tr1 and Tr2 are serially arranged in this order between the power source VPOWER and the data line, as shown in FIG. 5. However, the transistors Tr1 and Tr2 can be arranged in the reverse order.

The embodiment can be modified such that a signal PRGH, other than the signals $PRGH_0$ to $PRGH_i$, is used as a PRGBIAS signal to be applied to the gate of the transistor Tr1.

Figure 6:
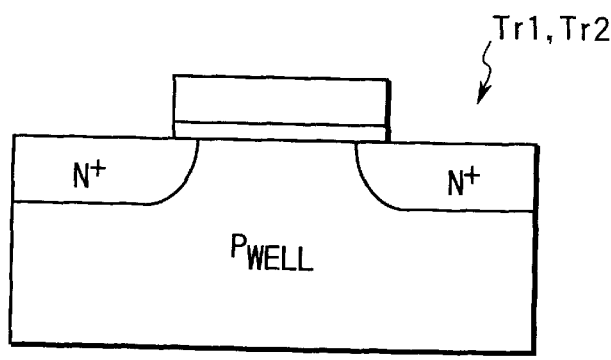
FIG. 6 is a cross sectional view of a structure of a transistor shown in FIG. 5.

It is possible to use as the transistors Tr1 and Tr2 a transistor as shown in FIG. 6, in which no ion has been injected in the channel region. In this case, the threshold voltage Vth of the transistor can be controlled by adjusting the concentration of a P-well (if the transistor is a P-channel MOS transistor) in the substrate as shown in FIG. 6. With this structure, increase in the internal voltage and variance in the threshold voltage Vth can be further suppressed.

The size of each of the load circuit $15_{00}$ to $15_{ij}$ is 1/(the number of the blocks) the size of the transistor circuit required to write data of 1 bit. Since the transistor is thus very small, it does not adversely affect the integration of the memory device.

As has been described in detail, according to the present invention, the load circuits, each having a small-size transistor circuit, are individually provided for the memory cell arrays of each block. Therefore, the distances between the memory cell arrays and the load circuits are substantially equal. As a result, a semiconductor memory device is provided, in which the variance of the writing characteristics in the block can be easily suppressed.

The structure of the group of load circuits of the present invention is advantageous in that the designing is easier than that of the conventional layout. More specifically, according to the conventional art, it is necessary to design a load circuit which has a load applicable to memory cell arrays located both near and far from the load circuit. In contrast, according to the present invention, it is unnecessary to take such a matter of design into consideration.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

We claim:

1. A semiconductor memory device comprising:
    a plurality of memory cell arrays, in which memory cells are arranged in a matrix, said plurality of memory cell arrays being divided into a plurality of blocks;
    a plurality of selector circuits, respectively provided for the plurality of memory cell arrays, for selecting one of the plurality of memory cell arrays;
    a plurality of bus lines connected to memory cell arrays in each block, a number of said plurality of bus lines being same as that of the memory cell arrays in each block; and
    a plurality of load circuits for transferring data, respectively connected to said plurality of selector circuits, a number of said plurality of load circuits being the same as that of said plurality of memory cell arrays,
    wherein each of said plurality of circuits comprises a load transistor circuit having a control terminal to which a signal varying in accordance with write data is supplied.

2. The semiconductor memory device according to claim 1, wherein the memory cell arrays in each block are accessed in parallel through the bus lines.

3. The semiconductor memory device according to claim 1, wherein distances between said plurality of memory cell arrays and said plurality of load circuits are substantially equal.

4. The semiconductor memory device according to claim 1, wherein the transistor circuit comprises a first transistor a gate of which is connected to a writing voltage control power source and a second transistor a gate of which is applied with a signal varying in accordance with write data, the first and second transistors being connected in series between a first power source and a corresponding bus line.

5. The semiconductor memory device according to claim 4, wherein the first power source generates power having a potential boosted in the semiconductor memory device.

6. The semiconductor memory device according to claim 4, wherein the writing voltage control power source generates power higher by at least a threshold voltage of the first transistor than a drain voltage for writing data into a memory cell.

7. The semiconductor memory device according to claim 6, wherein the threshold voltage of the first transistor is controlled by adjusting a concentration of a well layer in the transistor.

8. The semiconductor memory device according to claim 4, wherein a high level of the signal varying in accordance with write data is higher than a level of a source signal of the writing voltage control power source.

9. A semiconductor memory device comprising:
    a plurality of memory cell arrays, in which memory cells are arranged in a matrix, said plurality of memory cell arrays being divided into a plurality of blocks;
    a plurality of selector circuits, respectively provided for the plurality of memory cell arrays, for selecting one of the plurality of memory cell arrays;
    a plurality of bus lines connected to memory cell arrays in each block, a number of said plurality of bus lines being same as that of the memory cell arrays in each block; and a plurality of load circuits for transferring data, respectively connected to said plurality of selector circuits, a number of said plurality of load circuits being the same as that of said plurality of memory cell arrays, and said plurality of load circuits functioning to supply the same amount of current to said plurality of bus lines, whatever block is activated in a writing operation, wherein each said plurality of load circuits comprises a transistor circuit having a control terminal to which a signal varying in accordance with write data is supplied.

10. The semiconductor memory device according to claim 9, wherein the memory cell arrays in each block are accessed in parallel through the bus lines.

11. The semiconductor memory device according to claim 9, wherein distances between said plurality of memory cell arrays and said plurality of load circuits are substantially equal.

12. The semiconductor memory device according to claim 9, wherein the transistor circuit comprises a first transistor a gate of which is connected to a writing voltage control power source and a second transistor a gate of which is applied with a signal varying in accordance with write data, the first and second transistors being connected in series between a first power source and a corresponding bus line.

13. The semiconductor memory device according to claim 12, wherein the first power source generates power having a potential boosted in the semiconductor memory device.

14. The semiconductor memory device according to claim 12, wherein the writing voltage control power source generates power higher by at least a threshold voltage of the first transistor than a drain voltage for writing data into a memory cell.

15. The semiconductor memory device according to claim 14, wherein the threshold voltage of the first transistor is controlled by adjusting a concentration of a well layer in the transistor.

16. The semiconductor memory device according to claim 12, wherein a high level of the signal varying in accordance with write data is higher than a level of a source signal of the writing voltage control power source.

* * * * *